(12) United States Patent
Wu

(10) Patent No.: US 7,401,755 B2
(45) Date of Patent: Jul. 22, 2008

(54) DUAL-PURPOSE POSITION STRUCTURE USED AS HOOK AND DOCK

(75) Inventor: Wen-Ching Wu, Hsinchu (TW)

(73) Assignee: Alpha Networks, Inc., Hsinchu (TW)

( * ) Notice: Subject to any disclaimer, the term of this patent is extended or adjusted under 35 U.S.C. 154(b) by 763 days.

(21) Appl. No.: 10/873,121

(22) Filed: Jun. 23, 2004

(65) Prior Publication Data

US 2005/0288071 A1 Dec. 29, 2005

(51) Int. Cl.
*A47B 91/00* (2006.01)
(52) U.S. Cl. .............................. 248/346.07; 248/316.4; 248/222.51; 379/455; 379/454; 379/446
(58) Field of Classification Search ............ 248/346.07, 248/346.03, 346.06, 346.04, 316.1, 316.4, 248/309.1, 298.1, 689, 682, 220.21, 220.22, 248/222.51, 222.52; 379/455, 454, 426, 379/446; 24/455; 403/345, 373, 2, 105, 403/107
See application file for complete search history.

(56) References Cited

U.S. PATENT DOCUMENTS

| | | | | |
|---|---|---|---|---|
| 1,682,060 A | * | 8/1928 | Banks | ......................... 211/43 |
| 5,457,745 A | * | 10/1995 | Wang | ......................... 379/454 |
| 5,555,302 A | * | 9/1996 | Wang | ......................... 379/446 |
| 5,688,030 A | * | 11/1997 | McAnally et al. | ........ 312/223.2 |
| 5,836,563 A | * | 11/1998 | Hsin-Yung | ............... 248/316.4 |
| 6,073,901 A | * | 6/2000 | Richter | .................... 248/316.4 |
| 6,394,400 B1 | * | 5/2002 | Sontag | ......................... 248/97 |
| 6,446,913 B1 | * | 9/2002 | Schroeder | .................. 248/27.1 |
| 7,044,427 B2 | * | 5/2006 | Eckenswiller | ............... 248/523 |
| D541,141 S | * | 4/2007 | Chou | .......................... D8/383 |
| 2006/0278788 A1 | * | 12/2006 | Fan | .......................... 248/309.1 |

\* cited by examiner

*Primary Examiner*—Brian Glessner
*Assistant Examiner*—Todd M. Epps
(74) *Attorney, Agent, or Firm*—Bacon & Thomas, PLLC

(57) ABSTRACT

The present invention is to provide a dual-purpose position structure used as a hook and a dock comprising a base and another base, wherein the base is sheathed into the another base along a guiding track and two sides of a sliding trench of the base by using a guiding trench and two sides of a sliding plate of the another base, the another base is adjusted by engaging between a saw-toothed part of an elastic arm and a saw-toothed surface of the guiding track to form a dock with a size-adjustable containing space for setting an electronic apparatus therein or being hanged inversely on an office partition as a hook. At least one buckling device located on the supporting plate of the another base can be assembled with at least another buckling device located on a surface of the electronic apparatus.

6 Claims, 5 Drawing Sheets ly speaking, a number of wireless network apparatuses, for example, Hub, Switch, Modem, and so on, shown on the general market nowadays, each has a housing structure for fixing. These apparatuses are usually equipped with an antenna, which is well known by person skill in the art, for transmitting and receiving signals efficiently. Therefore, users can use a random wireless network apparatus to transmit and receive signals through a wireless network access point for establishing contact with outside world at any moment and obtaining largest benefit in the shortest time as well.

DUAL-PURPOSE POSITION STRUCTURE USED AS HOOK AND DOCK

BACKGROUND OF THE INVENTION

1. Field of the Invention

The present invention relates to a dual-purpose position structure used as a hook and a dock, more particularly to a dual-purpose position structure able to be assembled with a wireless network apparatus and sit on a table as a dock or, alternatively, be hanged inversely on an office partition as a hook for providing the advantages of good fixity and convenient operation and avoiding the wireless network apparatus from falling off.

2. Prior Art of the Invention

Generally speaking, a number of wireless network apparatuses, for example, Hub, Switch, Modem, and so on, shown on the general market nowadays, each has a housing structure for fixing. These apparatuses are usually equipped with an antenna, which is well known by person skill in the art, for transmitting and receiving signals efficiently. Therefore, users can use a random wireless network apparatus to transmit and receive signals through a wireless network access point for establishing contact with outside world at any moment and obtaining largest benefit in the shortest time as well.

Moreover, for complying with the users' demands of actual use, the manufacturers of the general wireless network apparatus usually designed different types of fixing structure to integrate the apparatus with the fixing structure so that the apparatus is capable of being set on the desk or hanged on the office partition. The users are therefore able to establish contact with outside world by using the wireless network apparatuses at any moment.

However, the present design of the fixing structure will result in complicated manufacturing process. In other words, two molds are needed to be designed/developed, one of these molds is a dock for use on the desk and the other mold is a hook that is hanged on the office partition. Moreover, the conventional hanging-type structure is peeled off easily. In addition, the developing costs of these molds as well as their manufacturing costs are high. Accordingly, every manufacturer should provide the present products and their deficiencies with improvements.

Furthermore, the applicant supplies an improved design to the present products and their deficiencies in accordance with actual demands of the users and marvelous developing of the present wireless network apparatuses on the market for interactive integrating the fixing structure with the wireless network apparatus. Meanwhile, the present invention has a dual purpose for being set on the desk or hanged on the office partition so as to dissolve the above problems. Therefore, the present invention contributes the sale results of wireless network apparatuses towards every manufacturer and is also good news for numerous customers. Accordingly, developing and producing a fixing structure with multiple purposes is indeed an important and urgent subject for present industries.

SUMMARY OF THE INVENTION

Whereas the above description two molds are needed to be designed and developed according to the conventional method, if a wireless network device is demanded for use on the desk or hanging on the office partition. But the higher developing cost will result in rising of the manufacturing cost, and the dual-purpose demand of users for use on the desk or as a hook is still not satisfied yet. The inventor had made long-term researches and experiments to finally develop "a dual-purpose position structure used as a hook and a dock" of the present invention according to demands of the market and users. The unique conception of the present invention is contributed hopefully to the public.

The intention of the present invention is to provide a dual-purpose position structure used as a hook and a dock. The position structure is provided with interactive action so that the fixity and operating of the position is good and convenient, and the structure to avoid falling off is provided thereon for satisfying requirements of users. The position structure comprises a base and another base, wherein the base is sheathed into the another base along a guiding track and two sides of a sliding trench of the base by using a guiding trench and two sides of a sliding plate of the another base, the another base is adjusted by engaging between a saw-toothed part of an elastic arm and a saw-toothed surface of the guiding track to form a dock with a size-adjustable containing space for setting an electronic apparatus in the containing space of the dock. Alternatively, the containing space can be hanged inversely on the office partition as a hook. At least one buckling device located on the supporting plate of the another base can be assembled to integrate with at least another buckling device located on a surface of the electronic apparatus.

The above and other objects, features and advantages of the present invention will become apparent from the following detailed description taken with the accompanying drawings.

DETAILED DESCRIPTION OF THE PREFERRED EMBODIMENT

Figure 1:
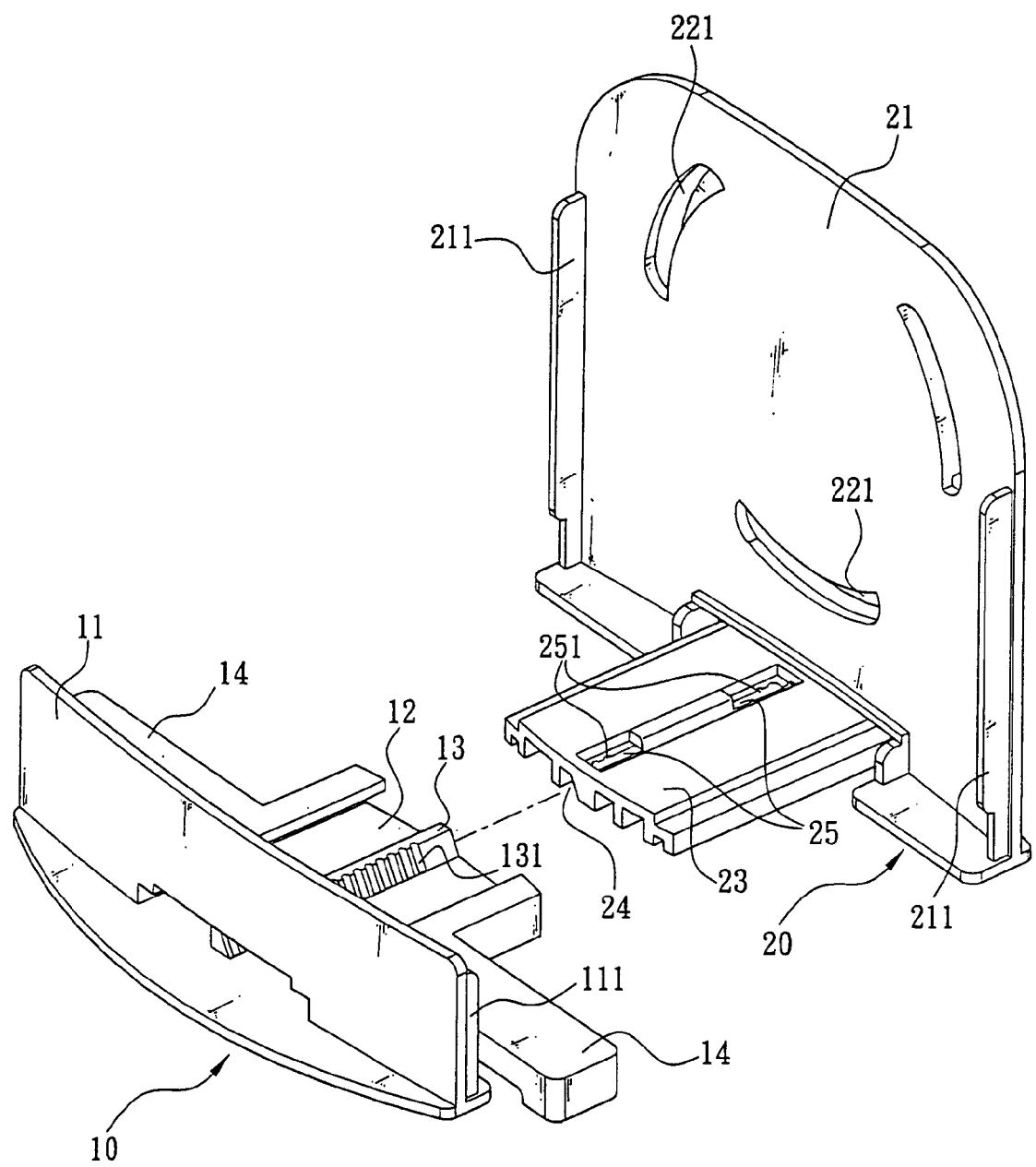
FIG. 1 is a schematic, elevational view showing a decomposed diagram of the present invention.

The present invention is a dual-purpose position structure used as a hook and a dock. Please refer to FIG. 1, the dual-purpose structure comprises a base 10, wherein a partition plate 11 is perpendicular to a bottom of the base and an U-shaped sliding trench 12 is extended outwardly from one side of the bottom of the base 10, which is adjacent to the partition plate 11. A guiding track 13 is located inside the sliding trench 12 and near a central part of the sliding trench 12. A saw-toothed surface 131, which has several saws arranged along a lengthy direction, is located on a slanted lateral of the guiding track 13, wherein an extended plate 14 is extended outwardly from each two corresponding sides of the U-shaped sliding trench 12 respectively so as to enlarge the entire contact area between the bottom of the base 10 and a supporting surface for steadier setting the base 10 on the supporting surface.

Please refer to FIG. 1 again, the dual-purpose position structure further comprises another base 20, which has a supporting plate 21 perpendicular to a bottom of the another base (as shown in FIG. 1, a height of the supporting plate 21 is higher than that of the partition plate 11). At least one buckling device 221 is located on a surface of the supporting plate 21 opposite to the base 10. A sliding plate 23 is extended outwardly from the bottom of the another base 20 toward the U-shaped sliding trench 12 of the base 10. A guiding trench 24 is located near a central part of a bottom of the sliding plate 23. An elastic arm 25 is located inside the guiding trench 24 and on one side of the guiding trench 24. A saw-toothed part 251 is located on one side of the elastic arm 25 at a position corresponding to the saw-toothed surface 131 of the guiding track 13 of the U-shaped sliding trench 12. Accordingly, as shown in FIG. 2, the base 10 is sheathed into the another base 20 along the guiding track 13 and two sides of the U-shaped sliding trench 12 of the base 10 by using the guiding trench 24 and two sides of the sliding plate 23 of the another base 20, the another base 20 is adjusted by interactive engaging between the saw-toothed part 251 of the elastic arm 25 and the saw-toothed surface 131 of the guiding track 13 (thus, users will have obvious feeling during sectional adjusting) to form a dock with size-adjustable containing space for setting an electronic apparatus 30, for example, wireless network device, in the containing space of the dock. Thus, the electronic device 30 can be set steadily on a desk. By the use of the dock, when the electronic device 30 is hit the extended plate 14 of the dock can provide larger contact area to reduce damage chance caused by toppling down.

Figure 3:
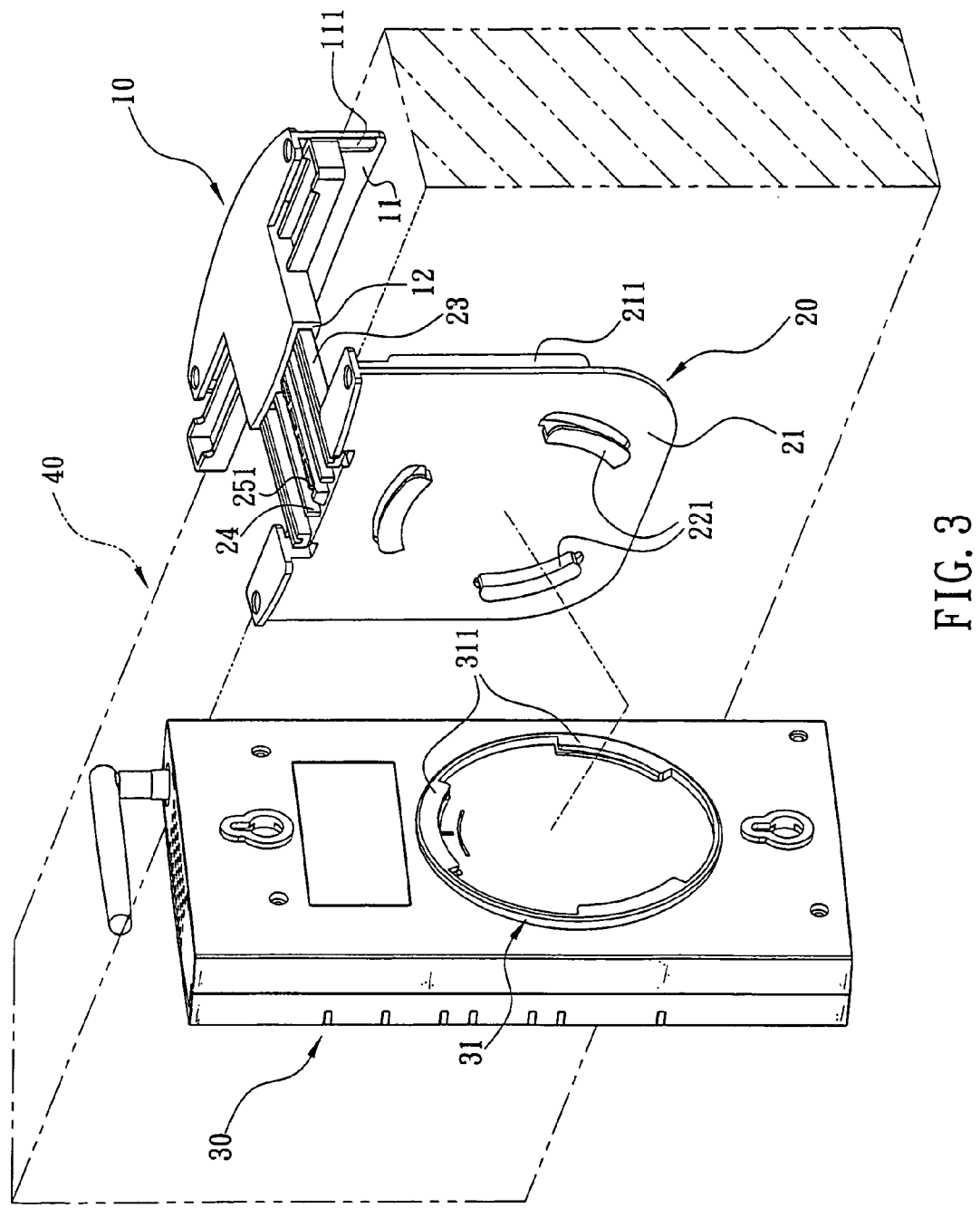
FIG. 3 is a schematic diagram showing the dock used as a hook according to the present invention.

Please further refer to FIG. 3, the size-adjustable containing space that is formed by sheathing the another base 20 into the base 10 can be hanged inversely on an office partition 40 for use as a hook. Meanwhile, for adapting to widths of different partitions 40 the only thing needed to do is adjusting the size of the containing space. The at least one buckling device 221 located on the supporting plate 21 of the another base 20 can be assembled to integrate with at least another buckling device 311 located on a surface of the electronic apparatus 30. Accordingly, the electronic apparatus 30 can be hanged steadily on the office partition 40 by the dock, and the dual-purpose for use as hook and dock is thus accomplished.

Figure 2:
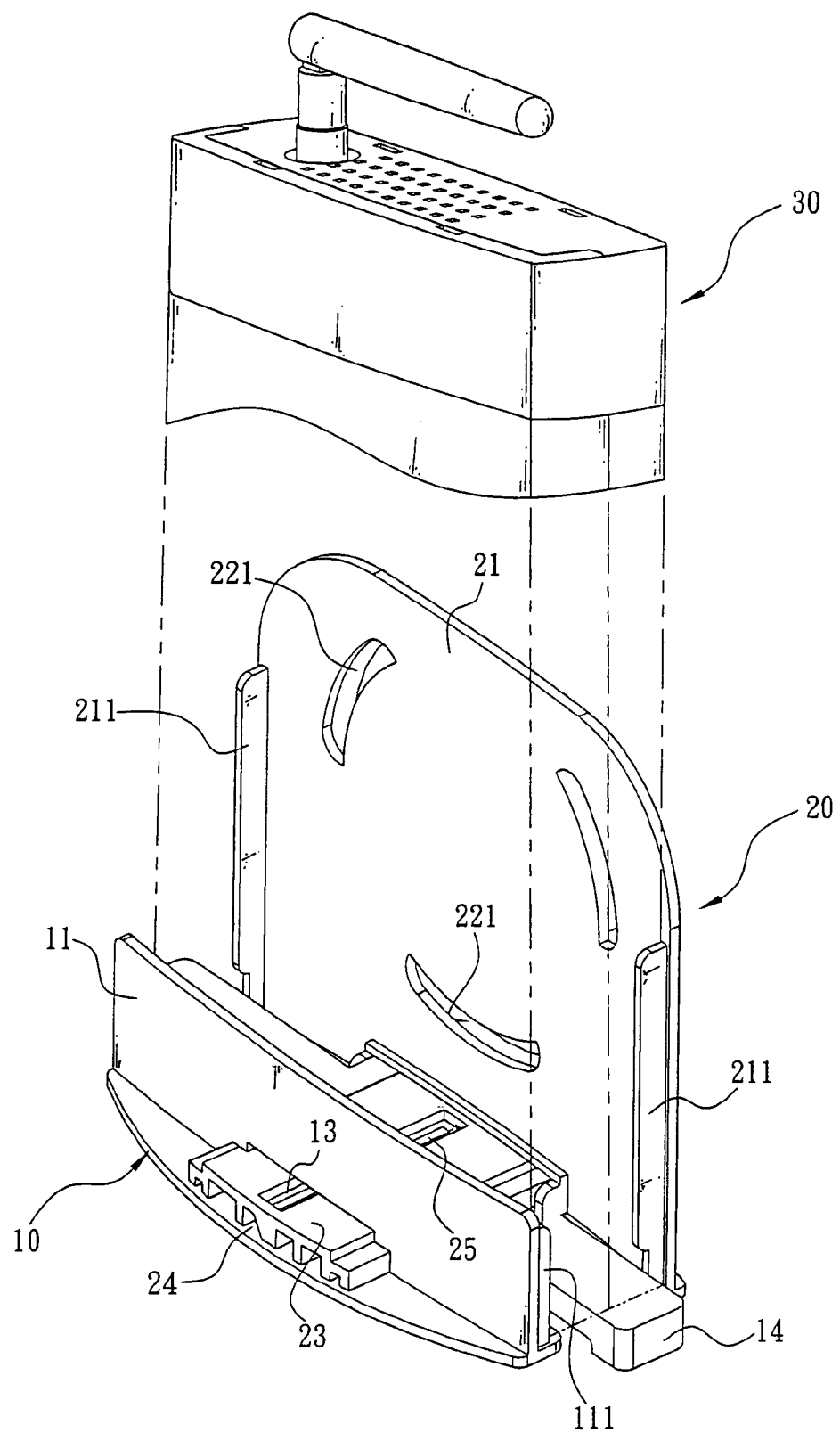
FIG. 2 is a schematic diagram showing a dock for use on a desk according to the present invention.

Please refer to diagrams shown in FIG. 1 and FIG. 3 again, in a preferred embodiment of the present invention the at least one buckling device 221 located on the supporting plate 21 of the another base 20 is arranged in an arc shape. The at least another buckling device 311 located on the surface of the electronic apparatus 30 is set on a turntable 31. The at least another buckling device 311 is set along the edge of the turntable 31 so that the electronic apparatus 30 and the supporting plate 21 is integrated with each other by assembling and an angle is adjustable by rotating. However, the practical application of the present invention is not limited herein. As long as the electronic apparatus 30 and the supporting plate 21 are enabled to integrate with each other the present invention can be designed in any form.

Figure 4:
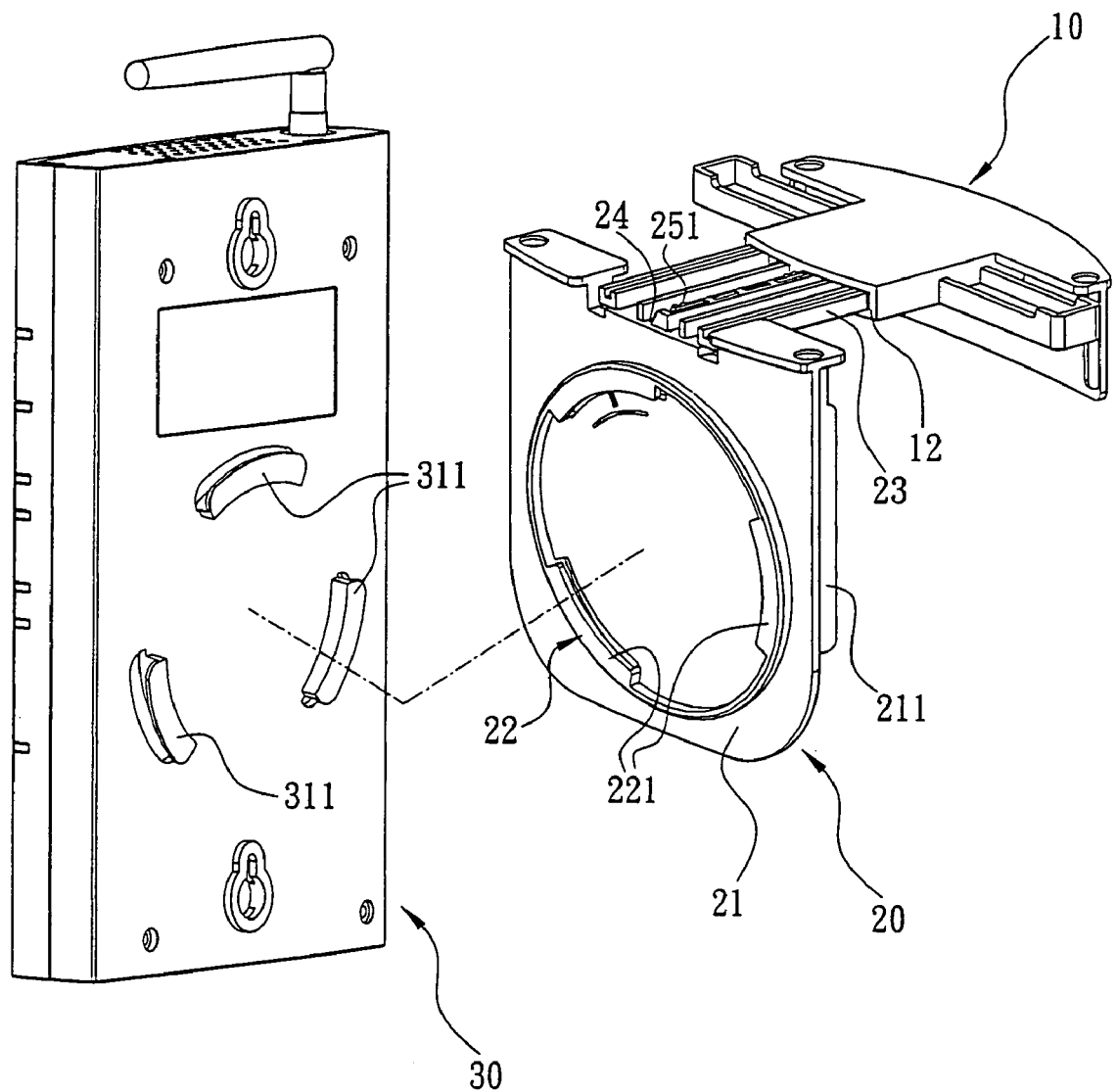
FIG. 4 is a schematic diagram showing a buckling device and another buckling device in accordance with another preferred embodiment of the present invention.

In another preferred embodiment of the present invention, as shown in FIG. 4, the at least one buckling device 221 located on the supporting plate 21 of the another base 20 is also set on a turntable 22. The at least one buckling device 221 is set along the edge of the turntable 22. The at least another buckling device 311 located on the surface of the electronic apparatus 30 is arranged in an arc shape so as to integrate the electronic apparatus 30 with the supporting plate 21 by assembling and to adjust an angle by rotating.

Figure 5:
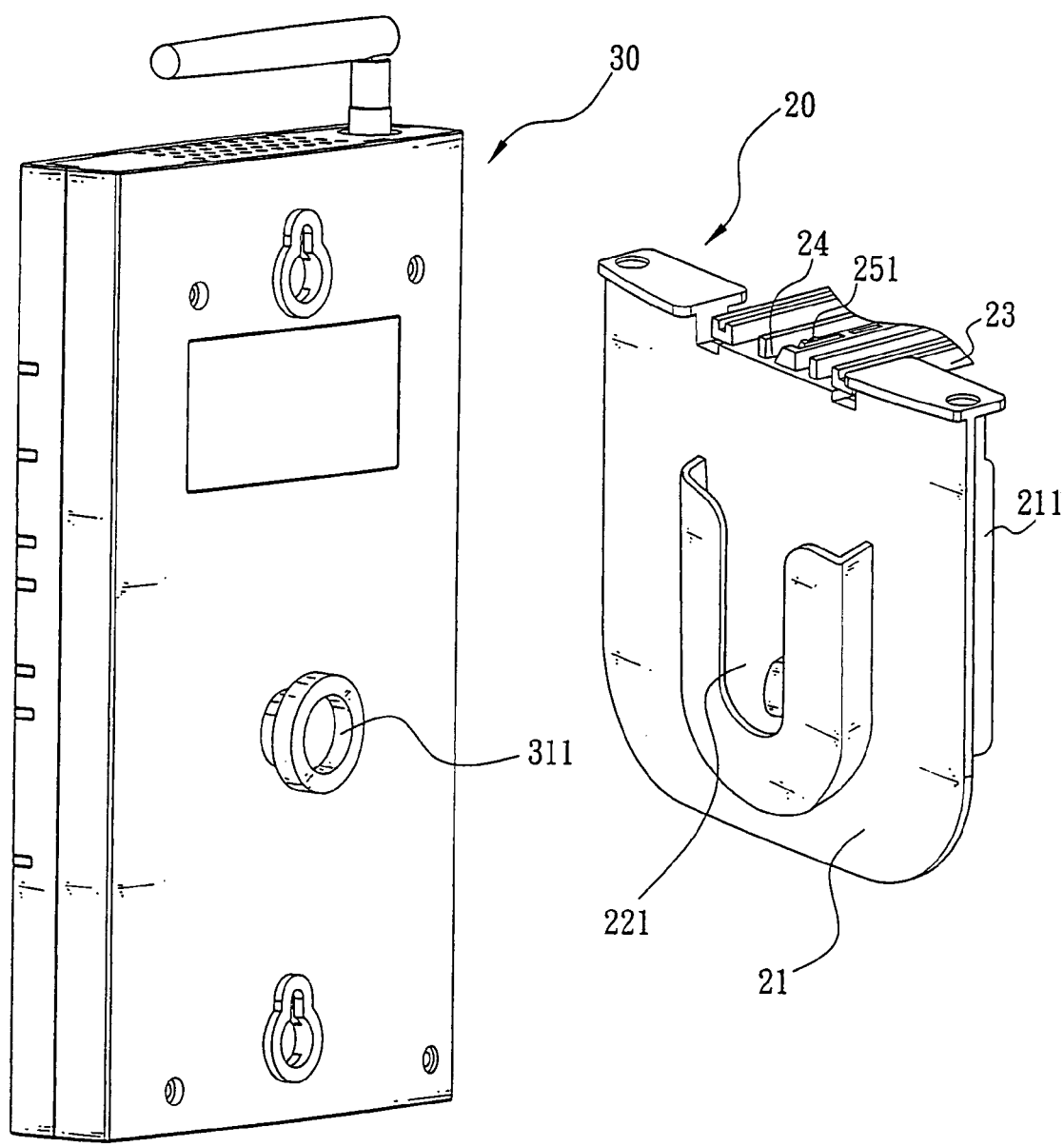
FIG. 5 is a schematic diagram showing a buckling device and another buckling device in accordance with still another preferred embodiment of the present invention.

Please refer to FIG. 5, which shows still another preferred embodiment of the present invention, the at least one buckling device 221 located on the supporting plate 21 of the another base 20 is a hanging hole. The at least another buckling device 311 located on the surface of the electronic apparatus 30 is a hanging hook corresponding to the hanging hole. However the actual application of the present invention is not limited herein, the present invention can be shown in any form as long as the electronic apparatus 30 and the supporting plate 21 are enabled to integrate with each other by assembling.

Moreover, please refer to FIG. 1 and FIG. 2 again, a side plate 111 and a side plate 211 are located on each two sides of the partition plate 11 of the base 10 and each corresponding two sides of the supporting plate 21 of the another base 20 respectively, so that a steadier clamping property is obtained when the electronic apparatus 30 is set in the containing space of the base.

According to the elements described above, it is clearly notified that a dock equipped with a size-adjustable containing space is formed by interactive sheathing between the base 10 and the another base 20. The electronic apparatus 30 can be set steadily on the desk by the use of the dock. The size-adjustable containing space that is formed by sheathing the base 10 into the another base 20 can be hanged inversely on an office partition 40 for use as a hook. Meanwhile, for adapting to widths of different office partitions 40 the only thing needed to do is adjusting the size of the containing space. An angle of the electronic apparatus 30 can be adjusted according to actual demands by rotating the turntable 31 located thereon to accomplish the purpose of signal receiving and transmitting for connecting outside world.

Therefore, the purpose of providing a position structure with dual-purpose of use as a hook and a dock is accomplished by using the design of the present invention. In addition, the present invention provides not only the advantage of simple structure but also the integrated design with interactive action so that the fixity of the present invention is good, and the structure to avoid falling off is located thereon. Furthermore, the operating of the present invention is convenient and suitable for dual-application, namely, use on the desk or hanging on different locations, for example, office partition 40, of the office to dissolve conventional deficiencies efficiently. Therefore, the present invention is indeed a humanity-oriented design.

While the invention has been described by means of specific embodiments, numerous modifications and variations could be made thereto by those skilled in the art without departing from the scope and spirit of the invention set forth in the claims.

The invention claimed is:

1. A dual-purpose position structure used as a hook and a dock, comprising:
   a base having a partition plate perpendicular to a bottom of the base, a sliding trench extended outwardly from one side of the bottom of the base adjacent to the partition plate, a guiding track located inside and near a central part of the sliding trench, and a saw-toothed surface located along a lengthy direction on a slanted lateral part of the guiding track; and
   another base having a supporting plate perpendicular to a bottom of the another base, at least one buckling device located on a surface of the supporting plate opposite to the base, wherein the at least one buckling device is set along the edge of a turntable on the surface of the supporting plate, a sliding plate extended outwardly from the bottom of the another base toward the sliding trench of the base, a guiding trench located near a central part of a bottom of the sliding plate, an elastic arm located inside and on one side of the guiding trench, and a saw-toothed part located on one side of the elastic arm at a position corresponding to the saw-toothed surface of the guiding track of the sliding trench;
   thereby, the base is sheathed into the another base along the guiding track and two sides of the sliding trench of the base by using the guiding trench and two sides of the sliding plate of the another base respectively, the space between the base and another base is adjustable by interactively engaging the saw-toothed part of the elastic arm with the saw-toothed surface of the guiding track to form the dock with a size-adjustable containing space for setting an electronic apparatus in the containing space of the dock, or for hanging the containing space inversely on a partition as a hook and enabling the at least one buckling device to be assembled with at least another buckling device located and arranged in an arc shape on a surface of the electronic apparatus so that the electronic apparatus is integrated with the supporting plate by assembling the at least one buckling device and the at least another buckling device together and is adjustable for rotating around the turntable to an angle with respect to the supporting plate.

2. The dual-purpose position structure used as a hook and a dock of claim 1, wherein an extended plate is extended outwardly from each two corresponding sides of the sliding trench respectively.

3. The dual-purpose position structure used as a hook and a dock of claim 1, wherein a side plate is located on each two sides of the partition plate of the base and each corresponding two sides of the supporting plate of the another base respectively.

4. A dual-purpose position structure used as a hook and a dock, comprising:

a base having a partition plate perpendicular to a bottom of the base, a sliding trench extended outwardly from one side of the bottom of the base adjacent to the partition plate, a guiding track located inside and near a central part of the sliding trench, and a saw-toothed surface located along a lengthy direction on a slanted lateral part of the guiding track; and another base having a supporting plate perpendicular to a bottom of the another base, at least one buckling device located on a surface of the supporting plate opposite to the base, wherein the at least one buckling device is located and arranged in an arc shape on the surface of the supporting plate, a sliding plate extended outwardly from the bottom of the another base toward the sliding trench of the base, a guiding trench located near a central part of a bottom of the sliding plate, an elastic arm located inside and on one side of the guiding trench, and a saw-toothed part located on one side of the elastic arm at a position corresponding to the saw-toothed surface of the guiding track of the sliding trench;

thereby, the base is sheathed into the another based along the guiding track and two sides of the sliding trench of the base by using the guiding trench and two sides of the sliding plate of the another base respectively, the space between the base and another base is adjustable by interactively engaging the saw-toothed part of the elastic arm with the saw-toothed surface of the guiding track to form the dock with a size-adjustable containing space for setting an electronic apparatus in the containing space of the dock, or for hanging the containing space inversely on a partition as a hook and enabling the at least one buckling device to be assembled with at least another buckling device located on a surface of the electronic apparatus along the edge of a turntable on the surface of the electronic apparatus so that the electronic apparatus is integrated with the supporting plate by assembling the at least one buckling device and the at least another buckling device together and is adjustable for rotating around the turntable to an angle with respect to the supporting plate.

5. The dual-purpose position structure used as a hook and a dock of claim 4, wherein an extended plate is extended outwardly from each two corresponding sides of the sliding trench respectively.

6. The dual-purpose position structure used as a hook and a dock of claim 4, wherein a slide plate is located on each two sides of the partition plate of the base and each corresponding two sides of the supporting plate of the another base respectively.

\* \* \* \* \*